United States Patent [19]
Liu et al.

[11] Patent Number: 5,541,875
[45] Date of Patent: Jul. 30, 1996

[54] HIGH ENERGY BURIED LAYER IMPLANT TO PROVIDE A LOW RESISTANCE P-WELL IN A FLASH EPROM ARRAY

[75] Inventors: David K. Y. Liu, Cupertino; Jian Chen, Sunnyvale, both of Calif.

[73] Assignee: Advanced Micro Devices, Inc., Sunnyvale, Calif.

[21] Appl. No.: 269,478

[22] Filed: Jul. 1, 1994

[51] Int. Cl.⁶ .......................... H01L 27/06; H01L 29/72
[52] U.S. Cl. .......................... 365/177; 365/182; 365/174; 257/382; 257/377; 257/400
[58] Field of Search .......................... 365/182, 185, 365/174, 900; 257/382, 377, 400

[56] References Cited

U.S. PATENT DOCUMENTS 4,429,326  1/1984  Watanabe et al. .......................... 365/185

FOREIGN PATENT DOCUMENTS 61-236154  10/1986  Japan .

Primary Examiner—Viet Q. Nguyen
Attorney, Agent, or Firm—Fliesler, Dubb, Meyer & Lovejoy

[57] ABSTRACT

A buried layer which is highly doped and implanted with high energy in a lightly doped isolated well in which an array of flash EPROM cells are provided. The buried layer is doped with the same conductivity dopant as the well in which it is provided, for example a $p^+$-type buried implant is provided in a p-type well. The buried layer enables channel size of the flash EPROM cells to be reduced providing a higher array density. Channels of the flash EPROM cells are reduced because the buried layer provides a low resistance path between channels of the flash EPROM cells enabling erase to be performed by applying a voltage potential difference between the gate and substrate of a cell.

7 Claims, 3 Drawing Sheets

HIGH ENERGY BURIED LAYER IMPLANT TO PROVIDE A LOW RESISTANCE P-WELL IN A FLASH EPROM ARRAY

BACKGROUND OF THE INVENTION

1. Field of the Invention

The present invention relates in general to memory arrays, and more particularly to techniques to increase the density of memory elements in a flash EPROM array.

2. Description of the Related Art

To reduce the size of memory cells in a flash EPROM array, and thus increase density, the structure of individual memory cells as well as the procedure for erasing the individual cells has been considered. To facilitate understanding how array density is increased, conventional flash EPROM cells and conventional procedures for erasing the cells are first described.

FIG. 1 shows a cross-sectional view of a conventional flash EPROM cell transistor 10 as fabricated in a flash EPROM array. The layers of the cell 10 are fabricated utilizing a wafer having a first conductivity type dopant, typically p-type.

A source region 16 and drain region 18 adjacent to the surface of the substrate 12 are provided by doping the substrate 12 with an n-type dopant to form regions of a second conductivity type, typically n-type, as shown. A short channel region 20 is defined by the area of the substrate adjacent the surface between the source 16 and drain 18 regions which remains p-type.

Layers of dielectric material 22 are deposited above the substrate 12 to isolate the substrate 12 from layers of the flash EPROM cell 10 which are to be deposited above the substrate 12. The dielectric material 22 is typically formed from silicon dioxide, also referred to as oxide. Dielectric material 22' is also shown which is utilized to form flash EPROM cells other than cell 10 which are additionally included in the flash EPROM array.

Provided above the channel 20 and a portion of the source 16 and drain 18 is a floating gate 24. The floating gate 24 is typically formed from a semi-conductive poly-silicon material which is isolated from the substrate by a layer of the dielectric material 22.

Provided above the floating gate 24 is a control gate 28 which is also typically formed from a poly-silicon material. The control gate 28 is isolated from the floating gate by a layer of the dielectric material 22.

A layer of conductive material is deposited to form a source line 32, control gate line 34 and a drain line 36 provided above the source 16, control gate 28 and drain 18 of the flash EPROM cell 10 respectively. The conductive lines 32, 34 and 36 are typically formed from metal and enable external electrical connections to be made to the source 16, control gate 28 and drain 18 respectively.

To program the core cell 10 a typical gate voltage of 9–12 V is applied to the control gate line 34, a typical drain voltage of 5–6 V is applied to the drain line 36 and the source line 32 is grounded. The voltages applied during programming enable electrons in the channel region 20 to overcome the energy barrier existing between the substrate 12 and the oxide 22 enabling the electrons to be driven onto the floating gate 24. The electrons stored on the floating gate 24 increase the threshold voltage of the cell, or the gate-to-source voltage potential difference required to turn the cell on. The floating gate 24 thereby stores charge representing a data bit.

In a conventional erase procedure, termed source erase, a potential difference is created by applying a gate voltage of approximately −10 V to the control gate line 34 and a source voltage of approximately +5 V to the source line 32 while floating the drain line 36. The voltage difference between the control gate 28 and source 16 enables electrons to be driven from the floating gate 24 to the source 16.

To reduce the size of a cell, and thus increase array density, it is desirable to reduce the channel length 20. But there is a limit to how much the channel length can be reduced due to band-to-band tunneling leakage current at the source when source erase is utilized. With the leakage current, power supplies in the array will not provide sufficient current to erase the cells. To prevent the leakage current, a double-diffused implant (DDI) is typically included at the source to reduce band-to-band tunneling and eliminate the leakage current from the source.

FIG. 2 shows a cross-section of a flash EPROM cell with a double-diffused source region 200. To create the double-diffused source region 200 a lightly doped n-type implant 202 is formed along the outer periphery of a heavily doped n$^+$-type implant region 204. The "+" symbol is utilized to indicate heavily doped as opposed to lightly doped regions.

With the n-type region 202 along the outer periphery of an n+-type region 204, the channel 20 can be slightly reduced from a typical n-type source region without a double-diffused source implant. However, with the n-type region 202 along the outer periphery of the source 204, the minimum size of the channel 20 is ultimately also limited. To increase array density, it is, therefore, desirable to reduce the channel size without including a double-diffused source implant.

A proposed alternative to the conventional source erase procedure is an erase procedure termed channel erase. Channel erase is accomplished by creating tunneling from the floating gate of a cell to its substrate rather than from the floating gate to the source as in source erase. An advantage of channel erase is that no band-to-band tunneling leakage current is generated during erase.

FIG. 3 shows an array of flash EPROM memory cells configured to employ channel erase. In order to control charge flow from the channels to provide channel erase, the memory cells are provided in a p-type well 300 which is isolated from the remainder of the substrate 12. The p-well 300 is isolated from the remainder of the substrate 12 by an n-well 302. To provide a connection to the substrate to enable channel erase, a p$^+$-type tap region 304 is provided in the p-well 300. A conductive channel line, C, is further deposited above the tap region to enable external connection to the tap region 304.

To employ channel erase, a potential difference is created by applying a gate voltage of approximately −8 V to the control gate line of a given memory cell while providing a channel voltage of approximately 8 V to the channel line. The voltage difference between the control gate line and channel line enables electrons to be driven from the floating gate of the given memory cell through its channel and through the p-well 300 and tap 304 into the channel line.

Usually the p-well 300 is lightly doped, and therefore has a high resistance. Because of the different lengths from the channels of memory cells to the tap region 304, different resistances illustrated by resistors $R_{1-3}$ occur in the p-well 300. In other words, the p-well creates a series resistance between channels of the memory cells.

During both programming and erase operations, a large amount of substrate current can be generated. With a high p-well resistance the large substrate current can de-bias the p-well 300 further increasing the values of resistances $R_{1-3}$ and preventing proper programming or erase from occurring.

FIG. 4 shows the array of flash EPROM memory cells of FIG. 3 configured to prevent the large series resistance during channel erase. The design of FIG. 4 prevents the high series resistance by including additional $p^+$-type tap regions, such as taps 401 and 402, spaced periodically in the memory array.

Although the design of FIG. 4 overcomes the high series resistance, the taps, such as 401 and 402, reduce the overall area available for cell layout. To increase array density, it is therefore not desirable to include taps 401–403.

SUMMARY OF THE INVENTION

The present invention enables reduction of the channel size of memory cells to increase array density.

The present invention employs channel erase to avoid double-diffused source regions.

The present invention further prevents the large series resistance typically occurring between channels of memory cells during channel erase without reducing the overall area available for cell layout.

The present invention is a highly doped layer implanted with high energy to enable the layer to be buried within an isolated well of a substrate in which memory cells are formed. The buried layer is doped with the same conductivity as the well in which it is provided, for example a $p^+$-type buried implant is provided in a p-type well. The buried layer provides a low resistance path between channels of memory cells eliminating the high series resistance during channel erase.

BRIEF DESCRIPTION OF THE DRAWINGS

Further details of the present invention are explained with the help of the attached drawings in which.

DETAILED DESCRIPTION

Figure 1:
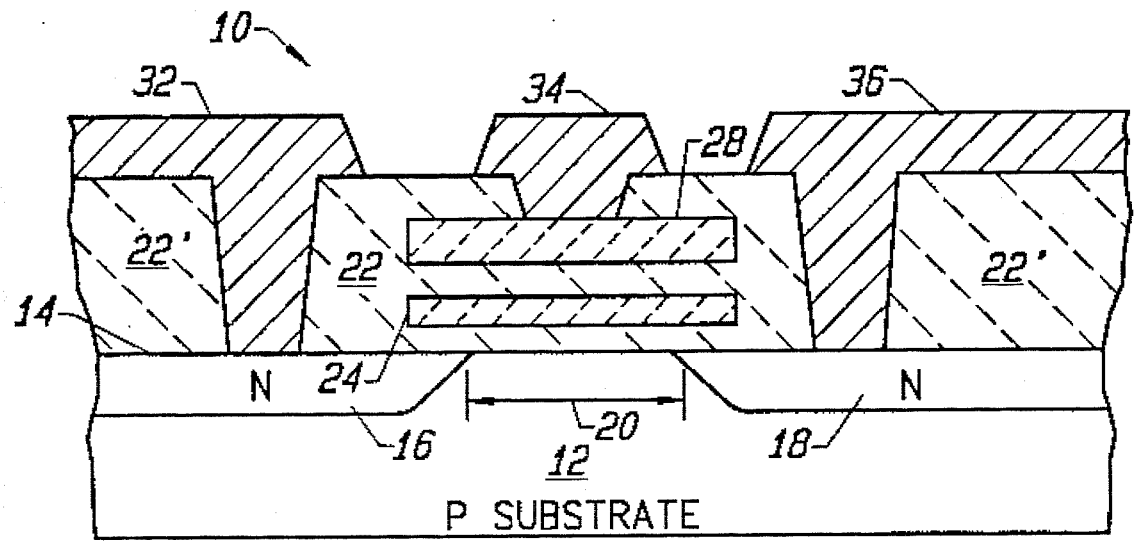
FIG. 1 shows a cross-section view of a typical flash EPROM memory cell transistor.
Figure 5:
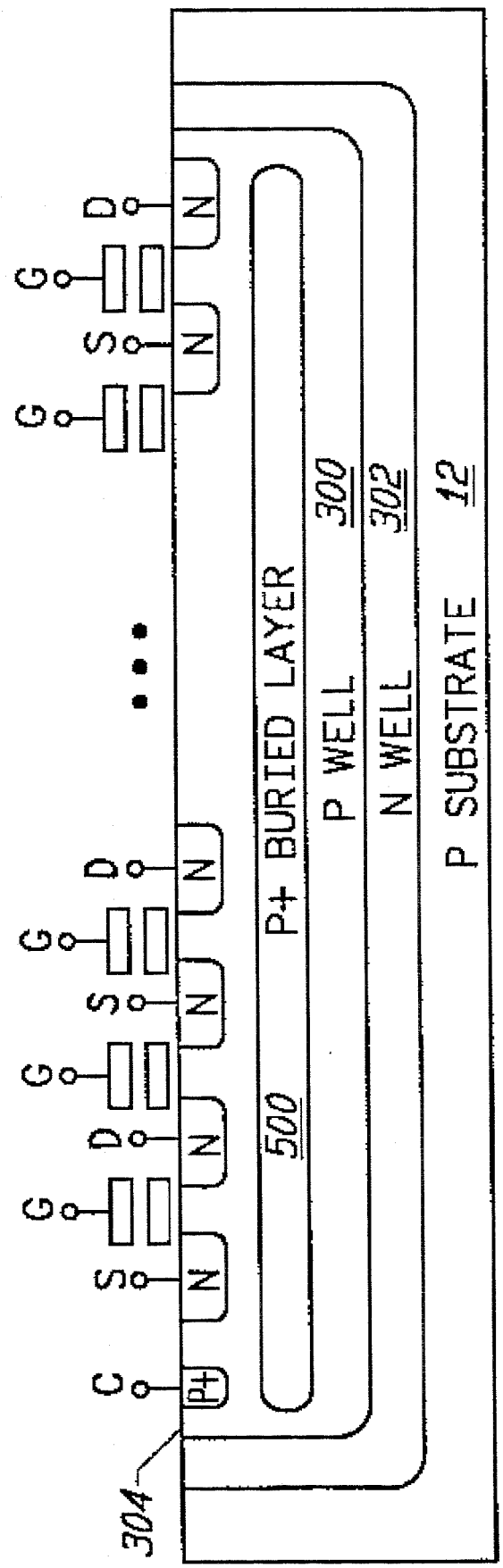
FIG. 5 shows an array of memory cells incorporating the present invention.

FIG. 5 shows an array of memory cells incorporating the present invention. The present invention includes a highly doped buried layer of a first conductivity type provided within a lightly doped well of the first conductivity type containing memory cells. For FIG. 5 having a p-type well 300 containing memory cells, the present invention includes a $p^+$-type buried layer 500. The present invention can be utilized with an array of flash EPROM memory cells fabricated as described with respect to FIG. 1, or other memory cell structures known in the art.

Figure 2:
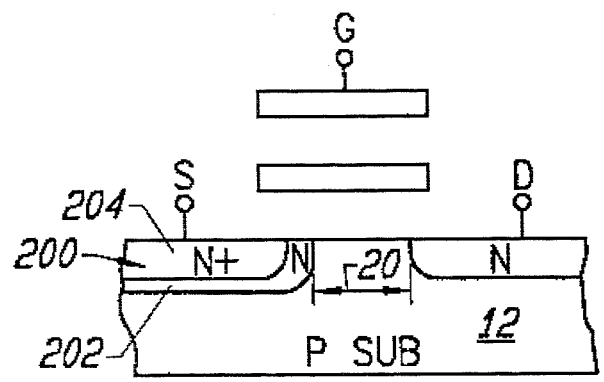
FIG. 2 shows a cross-section of a flash EPROM cell with a double-diffused source region.

To increase array density, the present invention enables utilization of channel erase, rather than source erase. By utilizing channel erase, channel size in the memory cells can be reduced beyond the minimum size limit for source erase because double-diffused source implants, as shown in FIG. 2, are not required to prevent leakage current.

Figure 3:
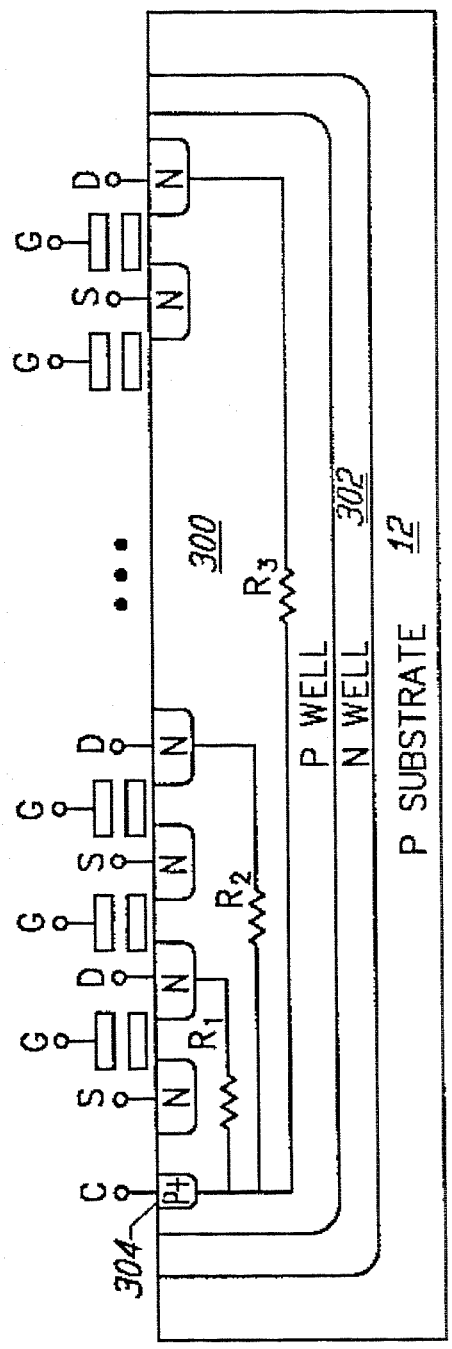
FIG. 3 shows an array of flash EPROM memory cells configured to employ channel erase.
Figure 4:
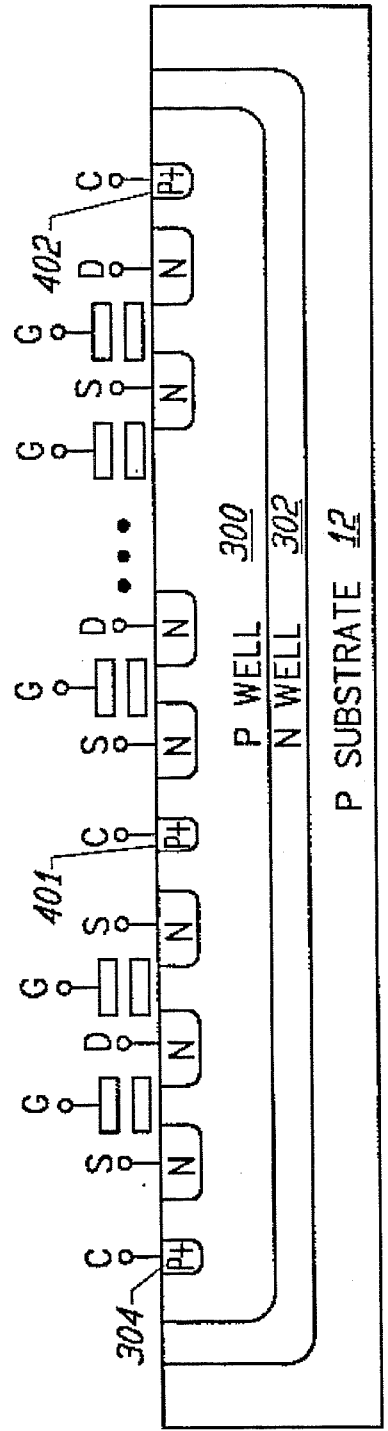
FIG. 4 shows the array of flash EPROM memory cells of FIG. 3 configured to prevent a large series resistance during channel erase.

To facilitate channel erase, as in FIG. 3, the p-well 300 is isolated from the remainder of the substrate 12 by an n-well 302. Further, as in FIG. 3, a $p^+$-type tap region 304 is included to provide a channel line contact to the p-well 300. As described previously, channel erase is performed by applying a potential difference between the control gate line of a given memory cell and the channel line, rather than between the control gate line and source line as in source erase. The potential difference applied for channel erase drives electrons from the floating gate of the given memory cell through its channel to the channel line.

The buried layer 500 is provided in the p-well 300 to prevent the high series resistance caused by the lightly doped p-well 300 during channel erase. To provide a low resistance path in the p-well, the p buried layer 500 underlies the channels of the array cells as well as the tap region 304. Spacing between the tap region 304 and the buried layer 500 of approximately 1 μm along with the substantial size of the buried layer 500, which may be large enough to be provided beneath millions of array cells, significantly reduces any resistance of the p-well 300 during channel erase.

The buried layer 500 is fabricated by implanting the p-well 300 with a high dose p-type dopant with sufficient energy to enable a $p^+$-type layer to be buried beneath the surface of substrate 12. Placement of the buried layer 500 is controlled to assure the buried layer is isolated from the n-well 302 and the remainder of the substrate 12 by the p-well 300. Without isolation from the n-well 302 and the remainder of the substrate 12, junction leakage and possible junction breakdown can occur. With junction leakage or junction breakdown occurring the buried layer 500 creates a path between the tap region 304 and a current sink supporting the substrate 12 which prevents an erase voltage applied to the channel line from affecting erase.

Although the invention has been described above with particularity, this was merely to teach one of ordinary skill in the art how to make and use the invention. Many modifications will fall within the scope of the invention, as that scope is defined by the claims which follow.

What is claimed is:

1. An electrical path provided to channels of an array of memory cells, the array of memory cells provided in a first well of a substrate having a first conductivity type which is lightly doped, the first well being provided in a second well of a second conductivity type, the electrical path comprising:

a buried layer having the first conductivity type which is highly doped provided within the first well, the buried layer being isolated from the second well by the first well.

2. The electrical path of claim 1 further comprising:

a conductive material forming a channel line provided above a surface of the substrate for carrying a channel current;

a tap of the first conductivity type which is heavily doped provided in the first well, the tap contacting the channel line for coupling the channel current to the buried layer, the buried layer provided for coupling the channel current to the channels of the array of memory cells.

3. The electrical path of claim 2 wherein the buried layer underlies the tap and the channels of the array of memory cells.

4. An electrical path provided to channels of an array of flash EPROM memory cells, the memory cells formed in a p-type well of a substrate, the electrical path comprising:

a $p^+$-type buried layer provided within the p-type well.

5. An electrical path provided to channels of an array of flash EPROM memory cells, the memory cells formed in a p-type well of a substrate, the p-type well being provided within an n-type well, the electrical path comprising:

a $p^+$-type buried layer provided within the p-type well and isolated from the n-type well by the p-type well.

6. The electrical path of claim 5, wherein the array of flash EPROM memory cells comprise:

a plurality of n-type source and drain regions provided in the p-type well separated from the buried layer by the p-type well, the source and drain regions defining the channels in the p-type well therebetween;

a $p^+$-type tap region provided in the substrate;

a plurality of polysilicon floating gates, each floating gate superposing one of the channels;

a plurality of control gates, each of the control gates superposing one of the floating gates; and a plurality of lines including a source line contacting the plurality of source regions, a drain line contacting the plurality of drain regions, a control gate line contacting the plurality of control gates, and a channel line contacting the tap region.

7. A method of erasing charge from the floating gates of the memory cells of claim 6 comprising:

applying a voltage difference between the control gate line and the channel line sufficient to drive charge from the floating gates.

\* \* \* \* \*